(12) United States Patent
Kajimoto

(10) Patent No.: US 10,651,422 B2
(45) Date of Patent: May 12, 2020

(54) WHITE-LIGHT-EMITTING APPARATUS INCLUDING PLURALITY OF ORGANIC ELECTROLUMINESCENT ELEMENTS

(71) Applicant: CANON KABUSHIKI KAISHA, Tokyo (JP)

(72) Inventor: Norifumi Kajimoto, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/394,977

(22) Filed: Apr. 25, 2019

(65) Prior Publication Data

US 2019/0252644 A1  Aug. 15, 2019

Related U.S. Application Data

(63) Continuation of application No. PCT/JP2017/038200, filed on Oct. 23, 2017.

(30) Foreign Application Priority Data

Oct. 28, 2016  (JP) ................. 2016-212129

(51) Int. Cl.
| | |
|---|---|
| *H01L 51/52* | (2006.01) |
| *H01L 51/50* | (2006.01) |
| *H01L 27/32* | (2006.01) |
| *G09F 9/30* | (2006.01) |
| *G09G 3/3208* | (2016.01) |

(52) U.S. Cl.
CPC ......... *H01L 51/5265* (2013.01); *G09F 9/30* (2013.01); *G09G 3/3208* (2013.01); *H01L 27/322* (2013.01); *H01L 51/504* (2013.01); *H01L 51/5218* (2013.01); *H01L 51/5234* (2013.01); *G09G 2300/0452* (2013.01); *H01L 2251/558* (2013.01)

(58) Field of Classification Search
None
See application file for complete search history.

(56) References Cited

U.S. PATENT DOCUMENTS

2013/0038640 A1* 2/2013 Kajimoto ............ H01L 51/5218
345/690

FOREIGN PATENT DOCUMENTS

| JP | 2009-224118 A | 10/2009 |
|---|---|---|
| JP | 2010-281953 A | 12/2010 |
| JP | 2011-142106 A | 7/2011 |
| JP | 2012-15097 A | 1/2012 |
| JP | 2012-504852 A | 2/2012 |

(Continued)

*Primary Examiner* — Herve-Louis Y Assouman
(74) *Attorney, Agent, or Firm* — Canon U.S.A. Inc., IP Division

(57) ABSTRACT

The present disclosure provides a light-emitting apparatus including a plurality of types of light-emitting pixels, each of the light-emitting pixels including a reflective electrode, an electrode-protective layer, an organic compound layer containing a light-emitting layer, and a light-output electrode in this order and having a resonator structure, wherein at least one type of the plurality of types of light-emitting pixels is a light-emitting pixel having a greater interference order than other types of light-emitting pixels, and the electrode-protective layer of the light-emitting pixel having the greater interference order has a greater layer thickness than the electrode-protective layers of the other types of light-emitting pixels.

20 Claims, 5 Drawing Sheets

(56) References Cited

FOREIGN PATENT DOCUMENTS

| | | |
|---|---|---|
| JP | 2012-182119 A | 9/2012 |
| JP | 2012-252863 A | 12/2012 |
| JP | 2013-157226 A | 8/2013 |
| JP | 2014-140048 A | 7/2014 |
| WO | 2013/065213 A1 | 5/2013 |

* cited by examiner

WHITE-LIGHT-EMITTING APPARATUS INCLUDING PLURALITY OF ORGANIC ELECTROLUMINESCENT ELEMENTS

CROSS-REFERENCE TO RELATED APPLICATIONS

This application is a Continuation of International Patent Application No. PCT/JP2017/038200, filed Oct. 23, 2017, which claims the benefit of Japanese Patent Application No. 2016-212129, filed Oct. 28, 2016, both of which are hereby incorporated by reference herein in their entirety.

TECHNICAL FIELD

The present invention relates to a white-light-emitting apparatus including a plurality of organic electroluminescent elements and to an image forming apparatus, a display apparatus, and an image pickup apparatus.

BACKGROUND ART

An organic electroluminescent element is an element including a pair of electrodes and an organic compound layer disposed therebetween. In a known configuration, a pair of electrodes constitutes a reflective electrode having a metal reflective layer and a transparent electrode. In recent years, organic electroluminescent elements that operate at low voltage have attracted attention. These organic electroluminescent elements have been put into practical use in light-emitting apparatuses such as low-profile displays, lighting instruments, head mounted displays, and electrophotographic printer print head light sources, where excellent features, for example, surface emission characteristics, light weight, and visibility, are utilized.

In particular, there is an increasing demand for a higher-definition organic electroluminescent display apparatus, and a system in which a white organic electroluminescent element and a color filter are used (hereafter referred to as a white+CF system) is known. In the white+CF system, an organic compound layer is deposited on the entire surface of a substrate by evaporation and, therefore, has a high yield compared with a system in which a high-definition metal mask is used. In addition, high definition is relatively readily realized because it is not necessary that pixel size and pixel pitch are taken into consideration.

Meanwhile, the white+CF system is not able to have an optimum output structure on a per-color basis. As a result, light-output efficiency is low, and a brightness factor resulting from absorption by a color filter is reduced. Therefore, realization of a high-efficiency white organic electroluminescent element capable of reducing power consumption has been desired.

PTL 1 describes a white+CF system light-emitting apparatus that exhibits low power consumption and high color purity, where a production process is suppressed from becoming complex. More specifically, it is disclosed that interference structures between colors are appropriately designed by forming a reinforcing conductive film on a transparent electrode layer with respect to only a blue-light-emitting pixel.

Meanwhile, PTL 2 discloses that corrosion and formation of a surface oxide film of a first electrode of an organic light-emitting element are suppressed by covering the first electrode with a coating layer. In this regard, it is disclosed that the coating layer exposed at an insulating film, in other words the coating layer in a light-emitting region, is removed. This is for the purpose of suppressing a reduction in reflectance of the first electrode.

CITATION LIST

Patent Literature

PTL 1 Japanese Patent Laid-Open No. 2012-252863
PTL 2: Japanese Patent Laid-Open No. 2009-224118

The light-emitting apparatus described in PTL 1 reduces the power consumption by enhancing interference of the blue-light-emitting pixel. However, the interference order of the blue-light-emitting pixel is different from the orders of red- and green-light-emitting pixels and, therefore, is a light-emitting apparatus having low view angle characteristics in the case in which a white color is displayed.

The light-emitting apparatus described in PTL 2 is a light-emitting apparatus including the coating layer so as to suppress corrosion and surface oxidation of the first electrode. However, the coating layer in the light-emitting region is removed so as to suppress a reduction in reflectance of the first electrode, and there is neither description nor indication that the coating layer is used to improve view angle characteristics in white light emission.

SUMMARY OF INVENTION

It is an object of the present invention to provide a light-emitting apparatus that is a display apparatus including light-emitting elements having different interference orders, that has high view angle characteristics, and that exhibits reduced power consumption.

The present disclosure provides a light-emitting apparatus including a plurality of types of light-emitting pixels, each of the light-emitting pixels including a reflective electrode, an electrode-protective layer, an organic compound layer containing a light-emitting layer, and a light-output electrode in this order and having a resonator structure, wherein at least one type of the plurality of types of light-emitting pixels is a light-emitting pixel having a greater interference order than other types of light-emitting pixels, and the electrode-protective layer of the light-emitting pixel having the greater interference order has a greater layer thickness than the electrode-protective layers of the other types of light-emitting pixels.

Further features of the present invention will become apparent from the following description of exemplary embodiments with reference to the attached drawings.

DESCRIPTION OF EMBODIMENTS

Figure 1:
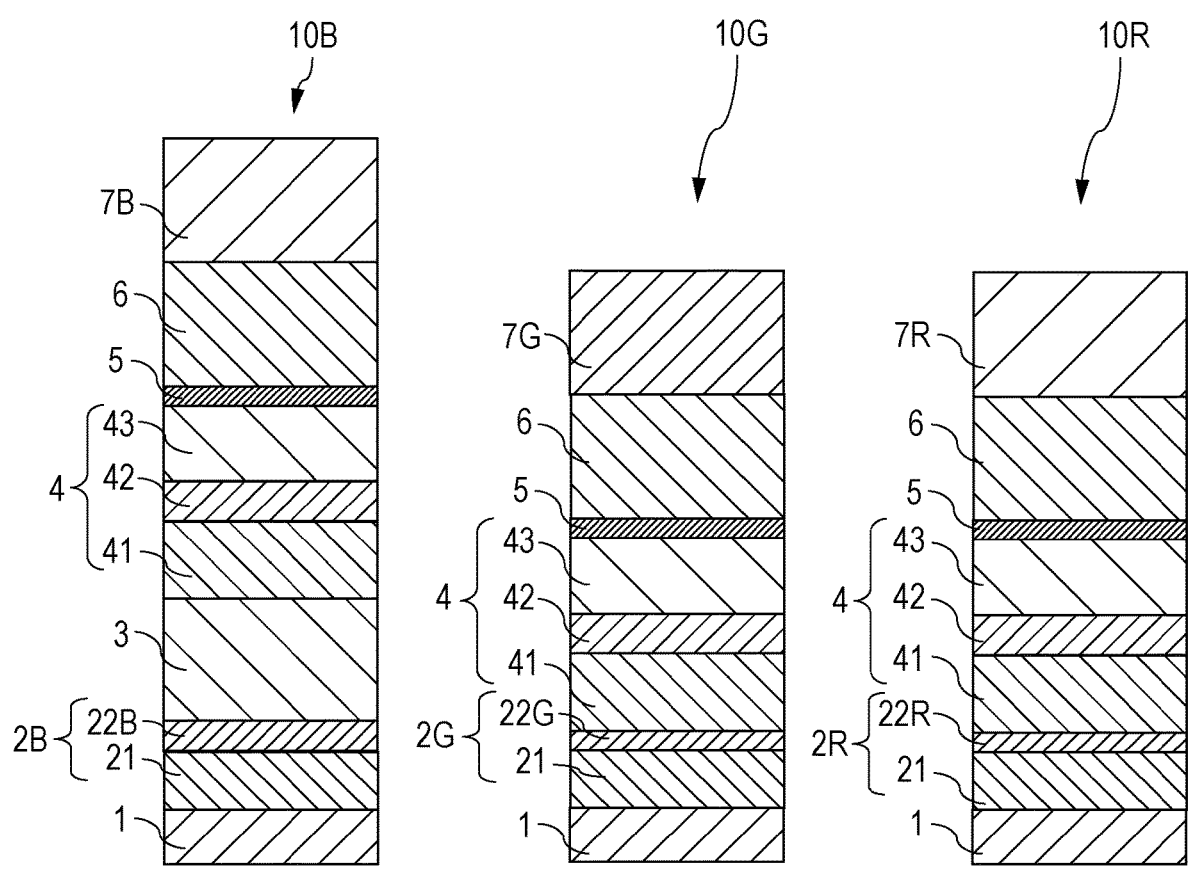
FIG. 1 is a schematic sectional view showing an example of an organic light-emitting apparatus according to an embodiment.

An aspect of the present invention is a light-emitting apparatus including a plurality of types of organic light-emitting elements, wherein at least one type of the plurality of types of light-emitting pixels has an interference order different from the other types of organic light-emitting pixels. In this light-emitting apparatus, an organic light-emitting element having a high interference order includes a thicker electrode-protective layer than the other organic light-emitting elements and, therefore, the light-emitting element has high view angle characteristics despite including organic light-emitting elements that have different interference orders. In this regard, a high interference order refers to a high constructive interference order in an organic light-emitting element having a resonator structure.

It is preferable that the electrode-protective layer have a higher visible light absorptance than an organic compound layer.

In addition, regarding the organic light-emitting element having a high interference order, it is preferable that the layer thickness of the electrode-protective layer be 5 nm or more greater than the layer thickness of the electrode-protective layers of the other organic light-emitting elements. As a result, view angle characteristics can be further improved.

The light-emitting apparatus may have a blue-light-emitting pixel, a green-light-emitting pixel, and a red-light-emitting pixel, and each light-emitting pixel may have a resonant structure. In order to reduce the power consumption of the organic light-emitting apparatus, the optical distance in the blue-light-emitting pixel is ¾ of the light-emission wavelength of a blue-light-emitting material, and the optical distances in each of the green-light-emitting pixel and the red-light-emitting pixel is ¼ of the light-emission wavelength of a light-emitting material.

The blue-light-emitting pixel may include an optical adjustment layer for the purpose of differentiating the optical distance from the optical distances in the other light-emitting pixels. Consequently, the optical distance between electrodes in the blue-light-emitting pixel can be configured to become greater than the optical distance between electrodes in each of the green-light-emitting pixel and the red-light-emitting pixel. It is possible to dispose the optical adjustment layer in only the blue-light-emitting pixel of the light-emitting pixel. When the optical adjustment layer is disposed in the blue-light-emitting pixel, organic layers other than the optical adjustment layer can be common layers. A common layer refers to, for example, a layer that is present in both the red-light-emitting pixel and the green-light-emitting pixel and that is formed continuously. The common layer may be referred to as a continuous layer.

Different interference orders may be adopted without performing optical adjustment. In this case, the thickness of any one layer of the organic compound layers becomes different compared with the layers in the other pixels.

The optical distance between the electrodes in the blue-light-emitting pixel is ¾ of λ. Therefore, the blue-light-emitting pixel tends to have low view angle characteristics compared with the green-light-emitting pixel and the red-light-emitting pixel.

Since the electrode-protective layer has a large layer thickness, the intensity of reflected light from the reflective electrode can be reduced compared with the case in which the electrode-protective layer has a small layer thickness. As a result, when the view angle is changed, balance between colors is maintained, and the white view angle characteristics become favorable. In the present specification, view angle characteristics refer to characteristics of changes that occur in emitted color when the view angle is increased, where the view angle at the front of the light-emitting apparatus is denoted as 0 degrees. Favorable view angle characteristics refer to an occurrence of a small extent of changes such as a color shift even in the case in which the view angle increases.

In the case in which the layer thickness of the electrode-protective layer of each color is the same, when white light is emitted, a change in only blue light emission relative to the view angle is different compared with the other colors. Consequently, the resulting organic light-emitting apparatus exhibits low view angle characteristics when white light is emitted.

In addition, the organic light-emitting apparatus according to the present invention has a resonant structure and, therefore, high light-output efficiency. As a result, power consumption is reduced.

The organic light-emitting apparatus according to the present invention has a resonant structure and includes, in the blue-light-emitting pixel, an electrode-protective layer that has a layer thickness less than the other electrode-protective layers. Therefore, the organic light-emitting apparatus ensures compatibility between view angle characteristics and a reduction in power consumption.

An organic electroluminescent element according to the present invention will be described below with reference to the embodiments. FIG. 1 is a schematic sectional view showing an example of an organic light-emitting apparatus according to the present invention.

The organic light-emitting apparatus shown in FIG. 1 includes a blue-light-emitting pixel 10B, a green-light-emitting pixel 10G, and a red-light-emitting pixel 10R on a substrate 1. R, G, and B express the respective emission colors. Hereafter, R, G, and B correspond to emission colors. Each light-emitting pixel includes a light-reflective electrode 2, an organic compound layer 4, a light-output electrode 5, a sealing layer 6, and a color filter 7 sequentially.

The light-reflective electrode 2B includes a metal electrode 21 and an electrode-protective layer 22B. The same applies to pixels that emit light of other colors.

The metal electrode 21 is desirably composed of a metal material having a reflectance of 80% or more at a light-emission wavelength. Specific examples include metals, for example, Al and Ag, and alloys in which Si, Cu, Ni, Nd, and the like are added to the above metals. In this regard, the light-emission wavelength refers to the range of the spectrum of the light emitted from a light-emitting layer.

Preferably, the electrode-protective layer 22 is composed of a material having a high hole injection property. Specific examples include metals, for example, Ti, W, Mo, and Au, and alloys thereof. The electrode-protective layer may be produced by a method of, for example, sputtering. In the case in which the electrode-protective layer is formed, even when the metal electrode is a metal such as Al that readily forms a surface oxide film, formation of the surface oxide film can be suppressed and an increase in voltage can be suppressed.

The blue-light-emitting pixel includes an optical adjustment layer 3. The optical adjustment layer is composed of a material that has a high transmittance and a low absorptance relative to light from the light-emitting layer. It is particularly preferable that the material have a high transmittance and a low absorptance relative to light in a blue range. The optical adjustment layer may include, for example, an insulating layer and a transparent conductive layer and may have a multilayer structure of these. Examples of the insulating layer include $SiO_2$ and SiON, and examples of the transparent conductive layer include ITO, IZO, AZO, and IGZO. It is possible to dispose the optical adjustment layer in only the blue-light-emitting pixel.

The organic compound layer 4 may include, for example, a hole transportation layer 41, a light-emitting layer 42, and an electron transportation layer 43. Each of the hole transportation layer and the electron transportation layer may be composed of a single layer or a plurality of layers. The light-emitting layer 42 is a white-light-emitting layer. The light-emitting layer may be composed of a single layer or a plurality of layers. When the light-emitting layer is composed of a plurality of layers, the plurality of light-emitting layers may be in contact with each other, or other layers may be interposed between layers.

When the light-emitting layer is composed of a plurality of light-emitting layers, two light-emitting layers, three light-emitting layers, or four or more light-emitting layers may be adopted.

When two light-emitting layers are included, a first light-emitting layer may be a light-emitting layer containing a blue-light-emitting material, and a second light-emitting layer may be a light-emitting layer containing a green-light-emitting material and a red-light-emitting material. Preferably, the first light-emitting layer is disposed nearer than the second light-emitting layer to the light-reflective electrode. An intermediate layer may be included between the first light-emitting layer and the second light-emitting layer.

When three light-emitting layers are included, a light-emitting layer containing a red-light-emitting material, a light-emitting layer containing a blue-light-emitting material, and a light-emitting layer containing a green-light-emitting material may be included. Preferably, the light-emitting layer containing a red-light-emitting material, the light-emitting layer containing a blue-light-emitting material, and the light-emitting layer containing a green-light-emitting material may be disposed in this order with respect to the light-reflective electrode. An intermediate layer may be included between the light-emitting layer containing a red-light-emitting material and the light-emitting layer containing a blue-light-emitting material.

Each layer in the organic compound layer may be composed of one type of compound or may be composed of a plurality of types of compounds. Specifically, the light-emitting layer may contain a host and a guest. The host is a compound having the greatest weight ratio in the light-emitting layer, and the guest is a compound mainly responsible for light emission.

Regarding the host, a known organic compound may be used. Examples include a naphthalene derivative, a chrysene derivative, an anthracene derivative, a pyrene derivative, a fluorene derivative, a fluoranthene derivative, a metal complex, a triphenylene derivative, a dibenzothiophene derivative, and a dibenzofuran derivative. It is possible for the organic compound to be composed of only one of these derivatives, or the organic compound may be composed of a plurality of derivatives in combination. In particular, an organic compound containing naphthalene and pyrene, an organic compound containing fluorene and pyrene, and an organic compound containing chrysene and triphenylene are preferable.

Preferably, the guest is a fluorene derivative, an anthracene derivative, a chrysene derivative, a pyrene derivative, a fluoranthene derivative, or a metal complex. In particular, an anthracene derivative containing aryl amines at position 9 and position 10, a chrysene derivative containing an aryl amine, a fluoranthene derivative, and a metal complex are preferable. Regarding the metal complex, an iridium complex is preferably used, and it is preferable that phenylisoquinoline be included as a ligand.

The hole transportation layer in the organic compound layer may contain a known hole transportation material. Examples include a naphthalene derivative, a phenanthrene derivative, a chrysene derivative, a pyrene derivative, a fluorene derivative, a fluoranthene derivative, a metal complex, a triphenylene derivative, a dibenzothiophene derivative, a dibenzofuran derivative, and an arylamine derivative. It is possible for the organic compound to be composed of only one of these derivatives, or the organic compound may be composed of a plurality of derivatives in combination. In addition, nitrogen atoms may be included between these. In particular, an aryl amine having a biphenyl group is preferable. Part of a biphenyl group may form a ring so as to form a carbazolyl group.

The layer thickness of the hole transportation layer has an influence on the optical distance between the light-emitting layer and the reflective electrode. In the blue-light-emitting pixel, the optical distance between the light-emitting layer and the light-reflective electrode is preferably 285 nm or more and may be 285 nm or more and 350 nm or less. The optical distance can be obtained as the product of physical distance and refractive index, and the refractive index is set to be the refractive index of light of 450 nm.

When the optical distance between the light-emitting layer and the light-reflective electrode is set to be the above-described distance, the view angle characteristics can be further improved.

The electron transportation layer in the organic compound layer may contain a known electron transportation material. Examples include a naphthalene derivative, a phenanthrene derivative, a chrysene derivative, a pyrene derivative, a fluorene derivative, a fluoranthene derivative, a metal complex, a triphenylene derivative, a dibenzothiophene derivative, a dibenzofuran derivative, and a carbazole derivative. It is possible for the organic compound to be composed of only one of these derivatives, or the organic compound may be composed of a plurality of derivatives in combination. In particular, an organic compound containing naphthalene and chrysene and an organic compound having a carbazolyl group and a heterocyclic ring containing a nitrogen atom are preferable. The heterocyclic ring containing a nitrogen atom is preferably pyridine, diazine, or triazine, and diazine is particularly preferable.

The layer thickness of the electron transportation layer has an influence on the optical distance between the light-emitting layer and a light-transmission electrode. The optical distance between the light-emitting layer and the light-transmission electrode is preferably 75 nm or less and may be 40 nm or more and 75 nm or less. The optical distance can be determined as the product of physical distance and refractive index, and the refractive index is set to be the refractive index of light of 450 nm.

When the optical distance between the light-emitting layer and the light-transmission electrode is set to be the above-described distance, the view angle characteristics can be further improved.

The light-output electrode 5 functions as a semitransparent reflective layer having a property of transmitting part of the light that reaches the surface and reflecting the other part (i.e., semitransparent reflectivity). The light-output electrode may be formed of an alkali metal, an alkaline earth metal, or an alloy containing these. Specific examples include a simple metal such as magnesium or silver, and an alloy containing magnesium or silver as a primary component.

The sealing layer 6 is a layer to protect the organic light-emitting apparatus from moisture and the like. The sealing layer may be composed of a single layer or a plurality of layers. The sealing layer may be composed of, for example, $SiO_2$, SiN, SiON, or $Al_2O_3$. The sealing layer may be formed by an evaporation method, a sputtering method, an atomic layer deposition method, or the like.

The color filter 7 is a filter configured to cut light of predetermined wavelengths in the emitted light. The color filter may be formed by a known method. A color filter in accordance with the emission color of each light-emitting pixel may be provided.

The optical distance between electrodes in each pixel of the organic light-emitting apparatus according to the present invention is a constructive interference structure. The constructive interference structure may also be called a resonant structure.

Regarding the light-emitting element, when the film thickness of each organic compound layer is set such that the brightness in particularly the front direction is increased, the emission color is controlled by optical interference, and light is emitted in the front direction with higher efficiency. In the case in which light with a wavelength $\lambda$ is designed, constructive interference can be established by adjusting a distance do from the position of light emission of a light-emitting layer to the reflective surface of a light-reflective material to $d_0 = i\lambda/4n_0$ (i=1, 3, 5, ... ).

As a result, a component in the front direction is increased in the emission distribution of the light with a wavelength $\lambda$, and front brightness is enhanced. In this regard, no represents an effective refractive index of the layers from the position of light emission to the reflective surface at the wavelength $\lambda$.

The optical distance Lr from the position of light emission to the reflective surface of the light-reflective electrode is represented by formula (1) below, where the total phase shift of the light with a wavelength $\lambda$ reflected at the reflective surface is denoted as $\phi r$ [rad]. In this regard, the optical distance L is the sum of the products of the refractive index $n_j$ of each layer and the thickness $d_j$ of each layer in the organic compound layer. That is, L can be represented by $\Sigma n_j \times d_j$ and also by $n_0 \times d_0$. In this regard, $\phi$ takes on a negative value.

$$Lr=(2m-(\phi r/\pi))\times(\lambda/4) \quad (1)$$

In formula (1) above, m represents an integer of 0 or more. In this regard, when $\phi=-\pi$, $L=\lambda/4$ applies at m=0, and $L=3\lambda/4$ applies at m=1. Hereafter, the condition corresponding to the above formula at m=0 is expressed as the $\lambda/4$ interference condition, and the condition corresponding to the above formula at m=1 is expressed as the $3\lambda/4$ interference condition.

The optical distance Ls from the position of light emission to the reflective surface of the light-output electrode is represented by formula (2) below, where the total phase shift of the light with a wavelength $\lambda$ reflected at the reflective surface is denoted as $\phi s$ [rad]. In formula (2) below, m' represents an integer of 0 or more.

$$Ls=(2m'-(\phi s/\pi))\times(\lambda/4)=-(\phi s/\pi)\times(\lambda/4) \quad (2)$$

Consequently, total layer interference L is represented by formula (3) below.

$$L=(Lr+Ls)=(2m-(\phi/\pi))\times(\lambda/4) \quad (3)$$

In this regard, $\phi$ represents the total phase shift ($\phi r+\phi s$) of the light with a wavelength $\lambda$ reflected at the reflective electrode and the light-output electrode.

At this time, regarding an actual organic electroluminescent element, there is no need to be in strict accord with the above formula in consideration of view angle characteristics and the like, which are in trade-off relationship with front output efficiency. Specifically, the value of L that satisfies formula (3) may have an error, the value of the error being within the range of $\pm\lambda/8$.

Therefore, regarding the organic light-emitting apparatus according to the present invention, it is preferable that formula (4) below be satisfied. Further preferably, the value of L is within the range of the value satisfying formula (3) $\pm\lambda/16$, and it is preferable that formula (4) below be satisfied.

$$(\lambda/8)\times(4m-(2\phi/\pi)-1)<L<(\lambda/8)\times(4m-(2\phi/\pi)+1) \quad (4)$$

$$(\lambda/16)\times(8m-(4\phi/\pi)-1)<L<(\lambda/16)\times(8m-(4\phi/\pi)+1) \quad (4')$$

Regarding an organic light-emitting apparatus, in order to emit white light with high color reproduction characteristics and high light-emission efficiency, it is preferable that the $3\lambda/4$ interference condition be applied to from a blue-light-emitting layer to a light-reflective electrode 20B and the $\lambda/4$ interference condition be applied to from a green-light-emitting layer to a light-reflective electrode 20G.

Regarding the total layer interference condition in a blue-light-emitting pixel, when the peak wavelength of light emitted from a blue-light-emitting material is denoted as $\lambda_b$ and the phase shift of light with a wavelength $\lambda_b$ reflected at the light-reflective electrode is denoted as $\phi_b$, it is preferable that the optical distance $L_b$ satisfy formula (5) below and further satisfy formula (5') below.

$$(\lambda_b/8)\times(3-(2\phi_b/\pi))<L_b<(\lambda_b/8)\times(5-(2\phi_b/\pi)) \quad (5)$$

$$(\lambda_b/16)\times(7-(4\phi_b/\pi))<L_b<(\lambda_b/16)\times(9-(4\phi_b/\pi)) \quad (5')$$

Formula (5) roughly indicates that $L_b$ is $3\lambda_b/4\pm\lambda_b/8$. Formula (5') roughly indicates that $L_b$ is $3\lambda_b/4\pm\lambda_b/16$. Therefore, $L_b$ may be $3\lambda_b/4\pm\lambda_b/8$. In addition, $L_b$ may be $3\lambda_b/4\pm\lambda_b/16$.

Meanwhile, regarding the total layer interference condition in a green pixel and a red pixel, when the peak wavelength of light emitted from a green-light-emitting material is denoted as $\lambda_g$ and the phase shift of light with a wavelength $\lambda_g$ reflected at the light-reflective electrode is denoted as $\phi_g$, it is preferable that the optical distance $L_g$ satisfy formula (6) below and further satisfy formula (6') below.

$$(\lambda_g/8)\times(-1-(2\phi_g/\pi))<L_g<(\lambda_g/8)\times(1-(2\phi_g/\pi)) \quad (6)$$

$$(\lambda_g/16)\times(-1-(4\phi_g/\pi))<L_g<(\lambda_g/16)\times(1-(4\phi_g/\pi)) \quad (6')$$

Formula (6) roughly indicates that $L_g$ is $\lambda_g/4\pm\lambda_g/8$. Formula (6') roughly indicates that $L_g$ is $\lambda_g/4\pm\lambda_g/16$. Therefore, $L_g$ may be $\lambda_g/4\pm\lambda_g/8$. In addition, $L_g$ may be $\lambda_g/4\pm\lambda_g/16$.

Meanwhile, the total layer interference condition in a green-light-emitting pixel and a red-light-emitting pixel may also be determined on the basis of the peak wavelength of light emitted from a red-light-emitting material. Specifically, formula (7) below and formula (7') below may be satisfied.

$$(\lambda_r/8)\times(-1-(2\phi_r/\pi))<L_r<(\lambda_r/8)\times(1-(2\phi_r/\pi)) \quad (7)$$

$$(\lambda_r/16)\times(-1-(4\phi_r/\pi))<L_r<(\lambda_r/16)\times(1-(4\phi_r/\pi)) \quad (7')$$

The peak wavelength of light emitted from a red-light-emitting material is denoted as $\lambda_r$ and the total phase shift of light with a wavelength $\lambda_r$ reflected at the light-reflective electrode is denoted as $\phi_r$.

In the case in which light-emitting layers are expressed as a first light-emitting layer and a second light-emitting layer, the peak wavelength of light emitted from the first light-emitting layer may be denoted as $\lambda_1$, and the peak wavelength of light emitted from the second light-emitting layer may be denoted as $\lambda_2$. In this regard, the optical distance between the first light-emitting layer and the reflective electrode is $3\lambda_1/4 \pm \lambda_1/8$, and the optical distance between the second light-emitting layer and the reflective electrode is $\lambda_2/4 \pm \lambda_2/8$.

The organic light-emitting apparatus that exhibits reduced power consumption is produced by applying the $3\lambda/4$ interference condition to a blue-light-emitting pixel and applying the $\lambda/4$ interference condition to a green-light-emitting pixel and a red-light-emitting pixel.

A light-emitting apparatus may include a red-light-emitting pixel, a green-light-emitting pixel, and a blue-light-emitting pixel, and these elements may be arrayed in a delta arrangement, a Bayer arrangement, or a stripe arrangement.

Meanwhile, the light-emission area may differ on a light-emission color basis, and it is preferable that the light-emission area of the blue-light-emitting pixel be greater than the light-emission areas of the other pixels.

It is preferable that a blue-light-emitting layer contain a fluorescence-emitting compound and a green-light-emitting layer and a red-light-emitting layer contain phosphorescence-emitting compounds.

The light-emitting apparatus according to the present embodiment may be used for an illumination apparatus, a display apparatus, and an exposure apparatus. Use for an illumination apparatus can provide an illumination apparatus having high view angle characteristics and a high color-rendering property.

A display apparatus may include a communication portion that sends image information to the light-emitting apparatus. Meanwhile, a position designation device may be included so as to overlap the display apparatus. The position designation device may be any one of a resistive film system, an electrostatic capacitance system, and an infrared system. In addition, the display apparatus may be used for a head mounted display.

Calculation Condition for Analysis

Figure 2:
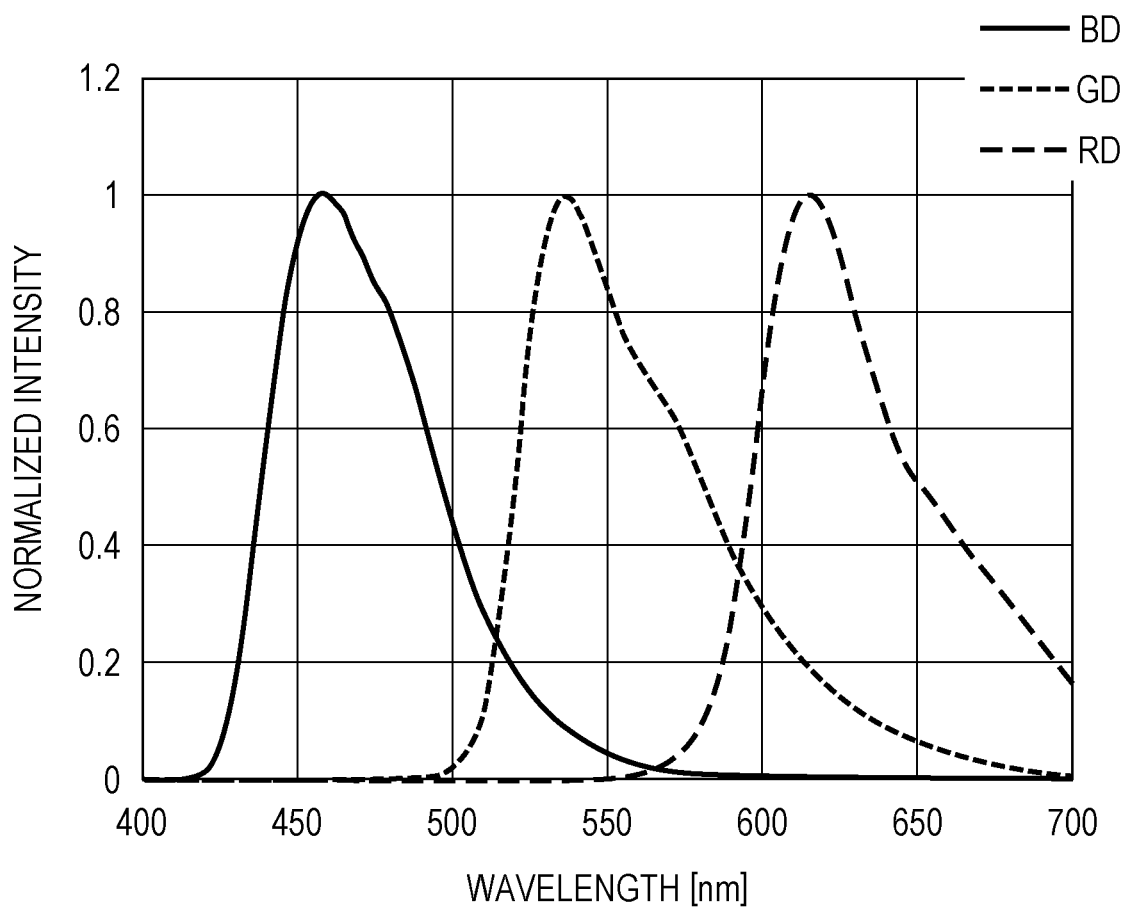
FIG. 2 is a diagram showing PL spectra of a light-emitting dopant that emits red light, a light-emitting dopant that emits green light, and a light-emitting dopant that emits blue light, which are used in an embodiment.

In the present embodiment, the effects of the present invention will be described by using simulation. FIG. 2 is a diagram showing PL spectra of a light-emitting dopant that emits red light (RD), a light-emitting dopant that emits green light (GD), and a light-emitting dopant that emits blue light (BD), which are used in the present embodiment. The PL spectra have been normalized by a maximum peak value. The light-emitting dopant that emits red light is expressed as RD, the light-emitting dopant that emits green light is expressed as GD, and the light-emitting dopant that emits blue light is expressed as BD.

Figure 3:
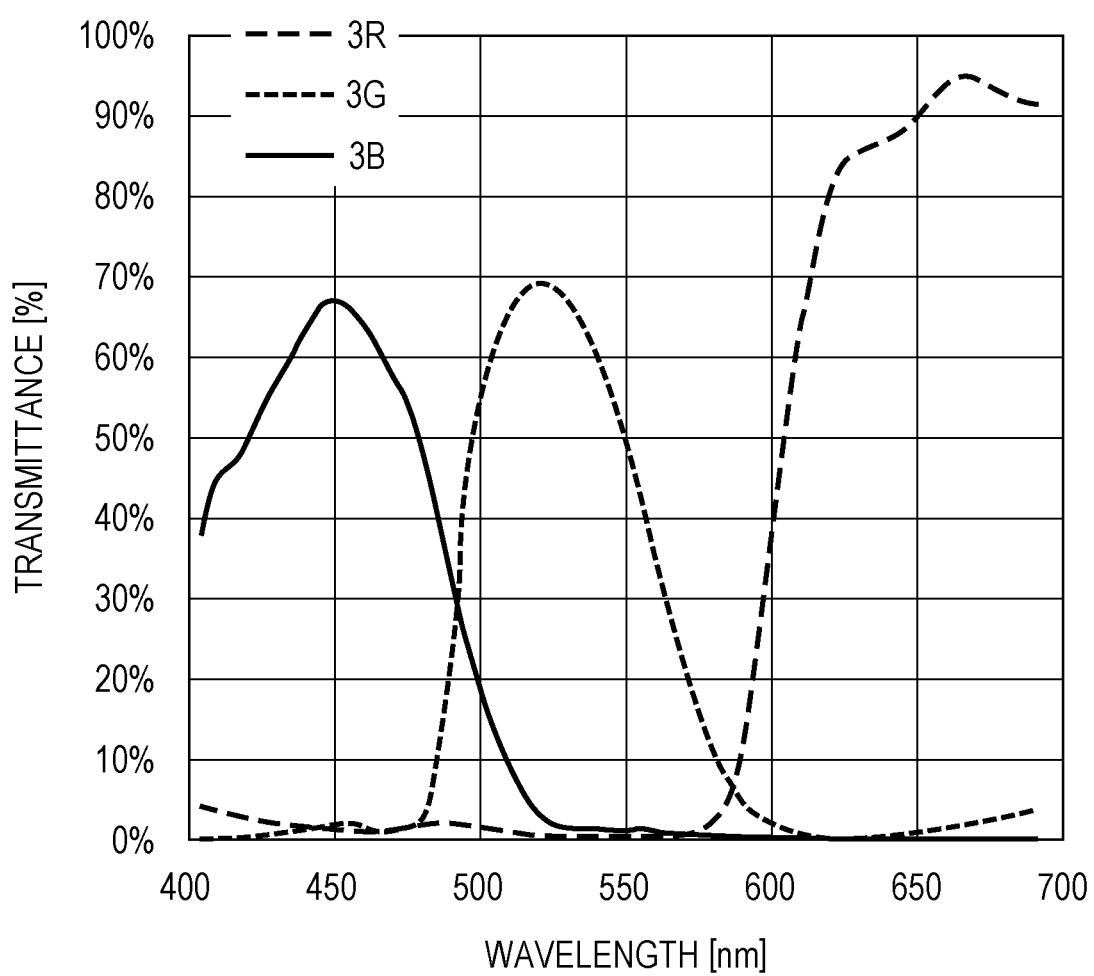
FIG. 3 is a diagram showing the relationship between the transmittance and the wavelength of color filters 7R, 7G, and 7B, which are used in the present embodiment.

FIG. 3 is a diagram showing the relationship between the transmittance and the wavelength of color filters 7R, 7G, and 7B, which are used in the present embodiment. The PL spectra and the color filters are not limited to the materials exhibiting the spectra shown as examples, and a combination that can optimize the display apparatus characteristics, for example, the gamut, may be used.

In the present embodiment, a multi-purpose optimization calculation was performed where the film thickness of a semitransparent electrode, the film thickness of each charge transportation layer, and exciton generation ratio $\gamma_b$, $\gamma_g$, and $\gamma_r$ of BD, GD, and RD, respectively, were adopted as variables. Table 1 shows the film thickness of each charge transportation layer and a lower limit value and an upper limit value of exciton generation ratio $\gamma$ of GD. In the following analysis, a light-emitting layer includes a first light-emitting layer and a second light-emitting layer, and the film thickness of each of the first light-emitting layer and the second light-emitting layer is 10 nm unless otherwise specified. One light-emitting layer was doped with only BD, and the other light-emitting layer was doped with mixed GD and RD (hereafter referred to as GD+RD).

The carrier balance was set to be 1, and each $\gamma$ was adjusted such that the total exciton generation ratio became 1 ($\gamma_b + \gamma_g + \gamma_r = 1$). In addition, all the emission yields of BD, GD, and RD in bulk were assumed to be 0.82. In this regard, the emission yield in bulk refers to an emission yield of a light-emitting dopant in the case in which no optical interference is present. A CPS method was used for the optical simulation. The CPS method is a well known technique in the field of OLED.

The multi-purpose optimization algorithm was performed by using NESA+, and the optimization calculation was performed so as to minimize the power consumption and the view angle characteristics. Meanwhile, Table 1 shows experimental conditions for success in each experiment. The values indicate light-emission characteristics in the front direction. In this regard, the view angle characteristics ($\delta u'v'$) are maximum values in chromaticity change at an angle of 30° relative to the direction of the normal to the substrate. The diagram of the relationship between the power consumption and the view angle characteristics based on the analytical result is a Pareto optimal solution composed of values in succeeded experiments.

TABLE 1

| | Lower limit | Upper limit |
|---|---|---|
| Multi-purpose optimization variables | | |
| Light-output electrode layer thickness [nm] | 10 | 15 |
| Electron transportation layer layer thickness [nm] | 10 | 45 |
| Hole transportation layer layer thickness [nm] | 40 | 60 |
| Optical adjustment layer layer thickness [nm] | 65 | 130 |
| BD exciton generation ratio $Y_b$ | 0.35 | 0.5 |
| GD exciton generation ratio $Y_g$ | 0.17 | 0.43 |
| Multi-purpose optimization conditions for success in experiment | | |
| Red-light-emitting-pixel chromaticity u' | 0.43 | 0.468 |
| Red-light-emitting-pixel chromaticity v' | 0.523 | — |
| Green-light-emitting-pixel chromaticity u' | 0.098 | 0.136 |
| Green-light-emitting-pixel chromaticity v' | 0.563 | — |
| Blue-light-emitting-pixel chromaticity u' | 0.15 | 0.18 |
| Blue-light-emitting-pixel chromaticity v' | — | 0.178 |

Table 2 shows the specification of the display apparatus, the specification being the precondition for calculating the power consumption in the present analysis. The aperture ratio of the pixel was set to be 50%, and the aperture ratio of the sub-pixel of each of R, G, and B was evenly set to be 16.7%. In the present analysis, an electric power required of the display apparatus with the specification shown in Table 1 for emitting white light having a color temperature of 6,500 K (CIE(x,y)=(0.313,0.329)) and brightness of 500 cd/m$^2$ was calculated. Specifically, the chromaticity and the light-emission efficiency of W were determined, and the currents required of R, G, and B were calculated. In the present analysis, the driving voltage was assumed to be 10.0 V, and the power consumption was calculated on the basis of the value of the required current.

TABLE 2

|  |  | Unit |
|---|---|---|
| Diagonal inch | 0.5 | [inch] |
| Vertical ratio | 3 |  |
| Horizontal ratio | 4 |  |
| Sub-pixel aperture ratio | 16.7 | [%] |
| Pixel aperture ratio | 50 | [%] |
| Target chromaticity of white-light emission CIE_x | 0.313 |  |
| CIE_y | 0.329 |  |
| Brightness of white-light emission | 500 | [cd/m$^2$] |
| Driving voltage (fixed) | 10 | [V] |

Analytical Result

Table 3 shows each of example D110 and comparative examples D100 and D101. In a light-emitting apparatus in the example, the layer thickness of an electrode-protective layer of the blue-light-emitting pixel is greater than the layer thicknesses of electrode-protective layers of the other light-emitting pixels. Meanwhile, in the comparative example, the layer thickness of an electrode-protective layer of the blue-light-emitting pixel is less than or equal to the layer thicknesses of electrode-protective layers of the other light-emitting pixels.

In the example and the comparative examples, an optical adjustment layer of the blue-light-emitting pixel was composed of $SiO_2$ and IZO in this order with respect to a substrate. The film thickness of IZO was fixed to 40 nm, and the film thickness of $SiO_2$ was set to be within the range of 45 to 90. A light-emitting layer had a configuration in which a first light-emitting layer and a second light-emitting layer were stacked in this order with respect to a substrate, each having a fixed film thickness of 10 nm.

Figure 4:
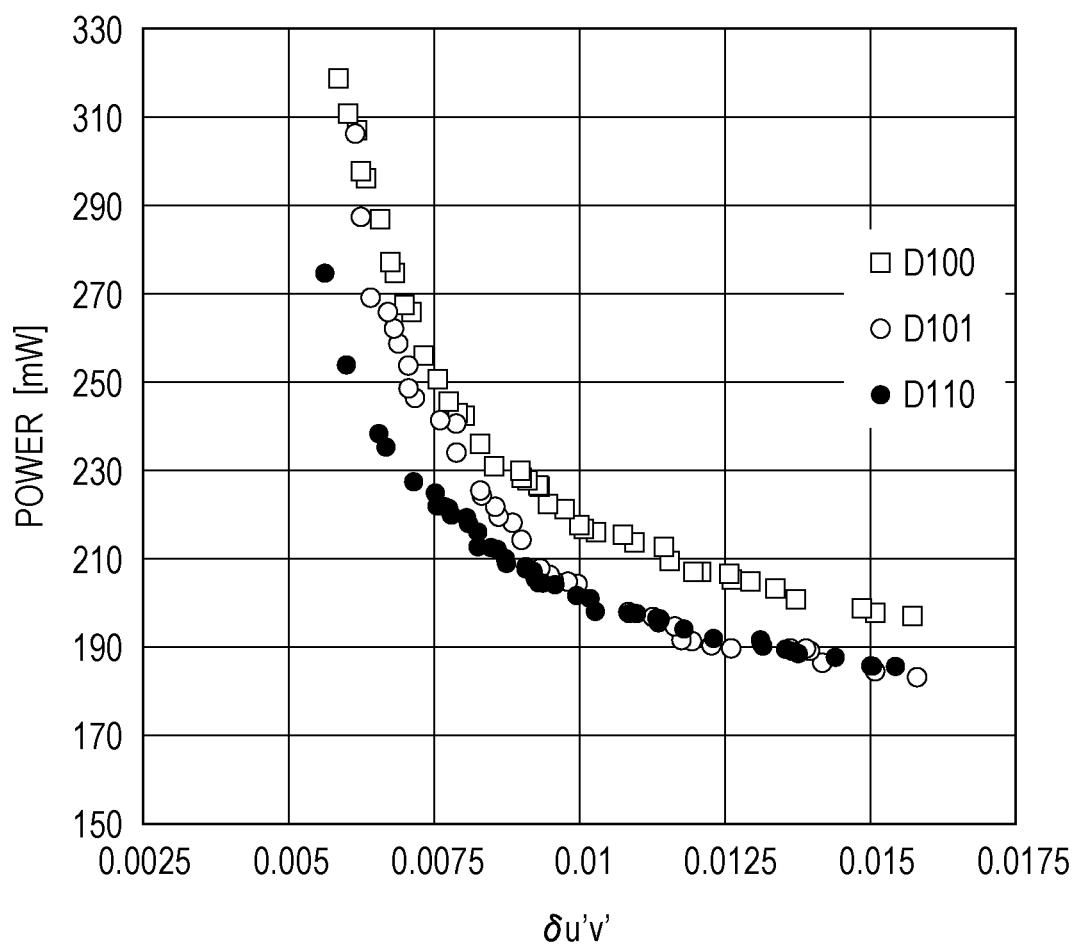
FIG. 4 is a diagram showing the relationship between the power consumption and the view angle characteristics ($\delta u'v'$) of an organic light-emitting apparatus of an example and organic light-emitting apparatuses of comparative examples.

FIG. 4 is a diagram showing the relationship between the power consumption and the view angle characteristics ($\delta u'v'$) of the organic light-emitting apparatus of the example and the organic light-emitting apparatuses of the comparative examples. The vertical axis indicates the power consumption, and the horizontal axis indicates the view angle characteristics. A smaller value of view angle characteristics indicates that the view angle characteristics are more favorable.

In this regard, in both the example and the comparative example, the view angle characteristics and a reduction in the power consumption are in trade-off relationship.

Table 4 shows the relationship between the view angle characteristics $\delta u'v'$ with the layer thickness of the electrode-protective layer of the blue-light-emitting pixel and the film thickness of the electrode-protective layer of the red- and green-light-emitting pixel, the layer thicknesses being set to be specific values.

Regarding the light-emitting layer in the configuration of the organic light-emitting apparatus shown in Table 4, in the same manner as Table 3, the first light-emitting layer was set to be BD, the second light-emitting layer was set to be GD+RD, and each film thickness was set to be 10 nm. Other film thicknesses and the exciton generation ratios were calculated in the range shown in Table 1. The optical adjustment layer disposed in the blue-light-emitting pixel was set to be only IZO, and the film thickness thereof was optimized in the range of 65 to 95 nm.

Table 4 shows the relationship between the view angle characteristics with the layer thickness of the electrode-protective layer of the blue-light-emitting pixel and the layer thickness of the electrode-protective layer of the red- and green-light-emitting pixel.

The values in Table 4 are results of the multi-purpose optimization calculation on the basis of the above-described configuration and variable ranges and are color shift $\delta u'v'$ values, where the power consumption was the same (200±1 mW).

TABLE 4

| | | Electrode-protective layer of blue-light-emitting pixel [nm] | | | | |
|---|---|---|---|---|---|---|
| | | 2 | 5 | 7 | 10 | 12 |
| Electrode-protective | 2 | 0.0082 | 0.0065 | 0.0054 | 0.004 | 0.0033 |
| layer of | 5 | 0.0095 | 0.0079 | 0.0068 | 0.0055 | 0.0047 |
| green- and | 7 | 0.0104 | 0.0088 | 0.0077 | 0.0064 | 0.0056 |
| red-light-emitting | 10 | 0.0116 | 0.0100 | 0.0089 | 0.0076 | 0.0068 |
| pixel [nm] | 12 | — | 0.0107 | 0.0097 | 0.0083 | 0.0075 |

In Table 4, the $\delta u'v'$ value decreases, that is, the view angle characteristics become high, as the layer thickness of the electrode-protective layer of the blue-light-emitting pixel increases. The $\delta u'v'$ value decreases as the layer thicknesses of the electrode-protective layer of the green-light-emitting pixel and the red-light-emitting pixel decrease.

TABLE 3

| | | Electrode-protective layer thickness [nm] | | Optical adjustment layer | First light-emitting layer | | Second light-emitting layer | |
|---|---|---|---|---|---|---|---|---|
| | | Blue-light-emitting pixel | Green- and Red-light-emitting pixels | thickness [nm] Blue-light-emitting pixel | Dopant | Layer thickness | Dopant | Layer thickness |
| D100 | Comparative example | 10 | 10 | IZO(40)/SiO$_2$(45-90) | BD | 10 | GD + RD | 10 |
| D101 | Comparative example | 2 | 5 | IZO(40)/SiO$_2$(45-90) | BD | 10 | GD + RD | 10 |
| D110 | Example | 10 | 5 | IZO(40)/SiO$_2$(45-90) | BD | 10 | GD + RD | 10 |

Regarding the element D110 that is the example, even when the $\delta u'v'$ value decreased, that is, even in a range in which the view angle characteristics were favorable, an increase in the power consumption was suppressed. Specifically, the power consumption was about 250 mW at $\delta u'v'$ of 0.006 and, therefore, was about 20% decreased compared with the power consumption in the comparative examples.

When the $\delta u'v'$ value is 0.007 or less, the view angle characteristics are high. For the purpose of realizing this, the layer thickness of the electrode-protective layer of the blue-light-emitting pixel is preferably 5 nm or more.

In the organic light-emitting apparatus according to the present invention, the $3\lambda/4$ interference condition is applied to the blue-light-emitting pixel and the $\lambda/4$ interference condition is applied to the green-light-emitting pixel and the red-light-emitting pixel. As the interference order increases, a reduction in brightness at a wide angle increases and, therefore, the brightness of the blue-light-emitting pixel is reduced significantly compared with the green-light-emitting pixel and the red-light-emitting pixel. That is, the color shift (δu'v' value) in white display according to the present configuration is derived from a reduction in the brightness of the blue-light-emitting pixel. As the layer thickness of the electrode-protective layer of the blue-light-emitting pixel decreases, the intensity of the reflected light from the reflective electrode is enhanced, and the intensity of interference is enhanced. As a result, the brightness in the front direction increases but the view angle characteristics are degraded.

Regarding the blue-light-emitting pixel under the 3λ/4 condition, it is preferable that the layer thickness of the electrode-protective layer be increased, and regarding the green-light-emitting pixel and the red-light-emitting pixel under the λ/4 condition, it is preferable that the layer thickness of the electrode-protective layer be decreased.

According to this configuration, the view angle characteristics can become favorable even when the power consumption is reduced by the constructive interference.

Figure 5:
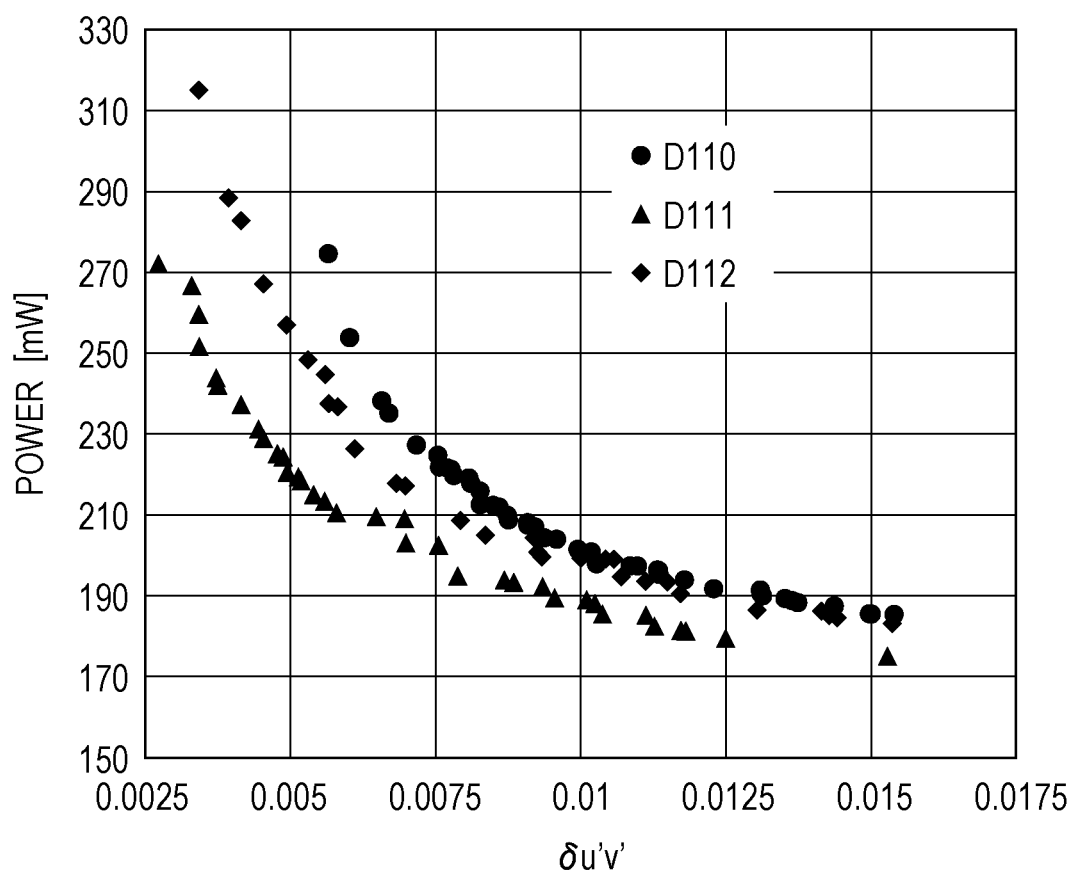
FIG. 5 is a diagram showing the relationship between the power consumption and the view angle characteristics δu'v' of each of examples D110, D111, and D112.

FIG. 5 is a diagram showing the relationship between the power consumption and the view angle characteristics δu'v' of examples D110, D111, and D112. The examples D110 to D112 had the configuration shown in Table 5.

D110 and D111 had the same configuration except that an order of stacking of the first light-emitting layer and the second light-emitting layer was different.

The example D112 included a first light-emitting layer, a second light-emitting layer, and a third light-emitting layer in this order with respect to a substrate, the first light-emitting layer contained RD, the second light-emitting layer contained BD, and the third light-emitting layer contained GD. In the example D112, an intermediate layer was disposed between the first light-emitting layer and the second light-emitting layer. The layer thickness of the intermediate layer was optimized within the range of 4 to 10 nm.

tion. Meanwhile, in a range (δu'v' of 0.015 to 0.01) in which the view angle characteristics were degraded, the power consumption of the element D110 and the power consumption of the element D111 were about 200 mW and 190 mW, respectively, and the difference was about 5%.

In a range in which the view angle characteristics were favorable, the power consumption of D111 was small and, therefore, the configuration was favorable for ensuring compatibility between a reduction in the power consumption and the view angle characteristics. Consequently, the configuration in which the light-emitting layer of GD+RD and the light-emitting layer of BD are stacked in this order with respect to the light-reflective electrode is preferable.

The organic light-emitting apparatus according to the present invention may be used for a display apparatus or an image display apparatus. The display apparatus or the image display apparatus may include the organic light-emitting apparatus according to the present invention and an active element connected to the organic light-emitting apparatus. Specific examples of the active element include a transistor and an MIM element. The active element may be a switching element that controls a timing of light emission of the organic light-emitting apparatus or an amplifying element that controls the brightness of the organic light-emitting apparatus.

The organic light-emitting apparatus according to the present invention may be used for an illumination apparatus. The illumination apparatus may include the organic light-emitting apparatus and a current conversion circuit, for example, a convertor circuit, connected to the organic light-emitting apparatus. Meanwhile, the illumination apparatus may include a casing and the organic light-emitting apparatus. The casing may include a heat dissipation portion. The heat dissipation portion releases the heat of the casing to the outside. The heat dissipation portion may be a metal plate or a fluid having a high specific heat.

As described above, the organic light-emitting apparatus according to the present invention can provide an organic

TABLE 5

| | | Electrode-protective layer layer thickness [nm] | | Optical adjustment layer layer thickness [nm] Blue-light-emitting pixel | First light-emitting layer | | Intermediate layer | Second light-emitting layer | | Third light-emitting layer | |
|---|---|---|---|---|---|---|---|---|---|---|---|
| | | Blue-light-emitting pixel | Green- and red-light-emitting pixels | | Dopant | Layer thickness [nm] | layer thickness [nm] | Dopant | Layer thickness [nm] | Dopant | Layer thickness [nm] |
| D110 | Example | 10 | 5 | IZO(40)/SiO$_2$(45-90) | BD | 10 | — | GD + RD | 10 | — | — |
| D111 | Example | 10 | 5 | IZO(40)/SiO$_2$(45-90) | GD + RD | 10 | — | BD | 10 | — | — |
| D112 | Example | 10 | 5 | IZO(40)/SiO$_2$(45-90) | RD | 4 | 4-12 | BD | 6 | GD | 8 |

As is clear from the examples D110 to D112 in FIG. 5, the curve of the power consumption versus the view angle characteristics changes because of a difference in multilayer configuration of the light-emitting layer.

D110 and D111 are compared in a range of u'v' of 0.0056 in which the view angle characteristics were favorable. When u'v' was 0.0056, the power consumption of the element D110 and the power consumption of the element D111 were about 275 mW and 210 mW, respectively, and the difference was about 25%. D111 had favorable view angle characteristics and exhibited a small power consumplight-emitting apparatus that ensures compatibility between view angle characteristics and a reduction in power consumption in white light emission.

According to the present invention, a light-emitting apparatus that is a display apparatus including light-emitting elements having different interference orders, that has high view angle characteristics, and that exhibits reduced power consumption.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A light-emitting apparatus comprising:
   a plurality of types of light-emitting pixels, each of the light-emitting pixels including a reflective electrode, an electrode-protective layer, an organic compound layer containing a light-emitting layer, and a light-output electrode in this order and having a resonator structure between the reflective electrode and the light-output electrode, and the electrode-protective layer having greater visible light absorptance than the organic compound layer,
   wherein at least one type of the plurality of types of light-emitting pixels is a light-emitting pixel having a greater resonator structure interference order than other types of light-emitting pixels, and
   the electrode-protective layer of the light-emitting pixel having the greater interference order has a greater layer thickness than the electrode-protective layers of the other types of light-emitting pixels.

2. The light-emitting apparatus according to claim 1, wherein the layer thickness of the electrode-protective layer included in the light-emitting pixel having a greater interference order is 5 nm or more.

3. The light-emitting apparatus according to claim 1, wherein the layer thickness of the electrode-protective layer included in the light-emitting pixel having a greater interference order is 5 nm or more greater than the layer thickness of the electrode-protective layers included in the other types of light-emitting pixels.

4. The light-emitting apparatus according to claim 1, wherein the electrode-protective layer contains Ti, W, Mo, and Au.

5. The light-emitting apparatus according to claim 1, wherein the light-emitting pixel having a greater interference order is a blue-light-emitting pixel, and the other types of light-emitting pixels are a green-light-emitting pixel and a red-light-emitting pixel.

6. The light-emitting apparatus according to claim 5, wherein the blue-light-emitting pixel includes an optical adjustment layer between the electrode-protective layer and the organic compound layer.

7. The light-emitting apparatus according to claim 1, wherein each of the plurality of types of light-emitting pixels includes a color filter,
   the organic compound layer is a layer that includes a first light-emitting layer containing a blue-light-emitting material and a second light-emitting layer and that emits white light by using the first light-emitting layer and the second light-emitting layer,
   the optical distance between the first light-emitting layer and the reflective electrode satisfies formula (1) below, and the optical distance between the second light-emitting layer and the reflective electrode satisfies formula (2) below, $$(\lambda_b/8)\times(3-(2\phi_b/\pi))<L_b<(\lambda_b/8)\times(5-(2\phi_b/\pi)) \quad (1)$$

in formula (1), $\lambda_b$ represents a peak wavelength of light emission of the first light-emitting layer, and $\phi_b$ (<0) [rad] represents the phase shift of light with a wavelength of $\lambda_b$ at the reflective electrode, $$(\lambda_g/8)\times(-1-(2\phi_g/\pi))<L_g<(\lambda_g/8)\times(1-(2\phi_g/\pi)) \quad (2)$$

in formula (2), $\lambda_g$ represents a peak wavelength of light emission of the second light-emitting layer, and $\phi_g$ (<0) [rad] represents the phase shift of light with a wavelength of $\lambda_g$ at the reflective electrode.

8. The light-emitting apparatus according to claim 1,
   wherein each of the plurality of types of light-emitting pixels includes a color filter,
   the organic compound layer is a layer that includes a first light-emitting layer containing a blue-light-emitting material and a second light-emitting layer and that emits white light by using the first light-emitting layer and the second light-emitting layer, and
   when the peak wavelength of light emission of the first light-emitting layer is denoted as $\lambda_1$ and the peak wavelength of light emission of the second light-emitting layer is denoted as $\lambda_2$,
   the optical distance between the first light-emitting layer and the reflective electrode is $3\lambda_1/4\pm\lambda_1/8$, and the optical distance between the second light-emitting layer and the reflective electrode is $\lambda_2/4\pm\lambda_2/8$.

9. The light-emitting apparatus according to claim 8, wherein the optical distance refers to a distance between a reflective-electrode-side surface of the first light-emitting layer or the second light-emitting layer and a reflective surface of the reflective electrode.

10. The light-emitting apparatus according to claim 8, further comprising an intermediate layer disposed between the first light-emitting layer and the second light-emitting layer.

11. The light-emitting apparatus according to claim 5, wherein the blue-light-emitting pixel, the green-light-emitting pixel, and the red-light-emitting pixel are disposed in a delta arrangement.

12. A display apparatus comprising the light-emitting apparatus according to claim 1 and a communication portion that sends image information to the light-emitting apparatus.

13. A display apparatus comprising the light-emitting apparatus according to claim 1 and an active element connected to the light-emitting apparatus.

14. An illumination apparatus comprising the light-emitting apparatus according to claim 1 and a current conversion circuit connected to the light-emitting apparatus.

15. A light-emitting apparatus comprising:
    a plurality of types of light-emitting pixels, each of the light-emitting pixels including a reflective electrode, an electrode-protective layer, an organic compound layer containing a light-emitting layer, and a light-output electrode in this order and having a resonator structure between the reflective electrode and the light-output electrode,
    wherein at least one type of the plurality of types of light-emitting pixels is a light-emitting pixel having a greater resonator structure interference order than other types of light-emitting pixels,
    the electrode-protective layer of the light-emitting pixel having the greater interference order has a greater layer thickness than the electrode-protective layers of the other types of light-emitting pixels,
    each of the plurality of types of light-emitting pixels includes a color filter,
    the organic compound layer is a layer that includes a first light-emitting layer containing a blue-light-emitting material and a second light-emitting layer and that emits white light by using the first light-emitting layer and the second light-emitting layer,
    the optical distance between the first light-emitting layer and the reflective electrode satisfies formula (1) below, and the optical distance between the second light-emitting layer and the reflective electrode satisfies formula (2) below, $$(\lambda_b/8)\times(3-(2\phi_b/\pi))<L_b<(\lambda_b/8)\times(5-(2\phi_b/\pi)) \quad (1)$$

in formula (1), $\lambda_b$ represents a peak wavelength of light emission of the first light-emitting layer, and $\phi_b$ (<0) [rad] represents the phase shift of light with a wavelength of $\lambda_b$ at the reflective electrode, $$(\lambda_g/8)\times(-1-(2\phi_g/\pi))<L_g<(\lambda_g/8)\times(1-(2\phi_g/\pi)) \quad (2)$$

in formula (2), $\lambda_g$ represents a peak wavelength of light emission of the second light-emitting layer, and $\phi_g$ (<0) [rad] represents the phase shift of light with a wavelength of $\lambda_g$ at the reflective electrode.

16. A display apparatus comprising the light-emitting apparatus according to claim 15 and an active element connected to the light-emitting apparatus.

17. An illumination apparatus comprising the light-emitting apparatus according to claim 15 and a current conversion circuit connected to the light-emitting apparatus.

18. A light-emitting apparatus comprising:
a plurality of types of light-emitting pixels, each of the light-emitting pixels including a reflective electrode, an electrode-protective layer, an organic compound layer containing a light-emitting layer, and a light-output electrode in this order and having a resonator structure between the reflective electrode and the light-output electrode, wherein at least one type of the plurality of types of light-emitting pixels is a light-emitting pixel having a greater resonator structure interference order than other types of light-emitting pixels, the electrode-protective layer of the light-emitting pixel having the greater interference order has a greater layer thickness than the electrode-protective layers of the other types of light-emitting pixels, each of the plurality of types of light-emitting pixels includes a color filter, the organic compound layer is a layer that includes a first light-emitting layer containing a blue-light-emitting material and a second light-emitting layer and that emits white light by using the first light-emitting layer and the second light-emitting layer, and when the peak wavelength of light emission of the first light-emitting layer is denoted as $\lambda_1$ and the peak wavelength of light emission of the second light-emitting layer is denoted as $\lambda_2$, the optical distance between the first light-emitting layer and the reflective electrode is $3\lambda_1/4\pm\lambda_1/8$, and the optical distance between the second light-emitting layer and the reflective electrode is $\lambda_2/4\pm\lambda_2/8$.

19. A display apparatus comprising the light-emitting apparatus according to claim 18 and an active element connected to the light-emitting apparatus.

20. An illumination apparatus comprising the light-emitting apparatus according to claim 18 and a current conversion circuit connected to the light-emitting apparatus.

* * * * *